US009437430B2

(12) United States Patent
Schowalter et al.

(10) Patent No.: US 9,437,430 B2
(45) Date of Patent: Sep. 6, 2016

(54) THICK PSEUDOMORPHIC NITRIDE EPITAXIAL LAYERS (75) Inventors: Leo J. Schowalter, Latham, NY (US); Joseph A. Smart, Mooresville, NC (US); James R. Grandusky, Albany, NY (US); Shiwen Liu, Acton, MA (US)

(73) Assignee: Crystal IS, Inc., Green Island, NY (US)

(*) Notice: Subject to any disclaimer, the term of this patent is extended or adjusted under 35 U.S.C. 154(b) by 1555 days.

(21) Appl. No.: 12/020,006

(22) Filed: Jan. 25, 2008

(65) Prior Publication Data

US 2008/0187016 A1 Aug. 7, 2008

Related U.S. Application Data (60) Provisional application No. 60/897,572, filed on Jan. 26, 2007.

(51) Int. Cl.
*H01L 31/0328* (2006.01)
*H01L 21/02* (2006.01)
*H01L 33/08* (2010.01)
*H01L 33/12* (2010.01)

(52) U.S. Cl.
CPC ....... *H01L 21/0262* (2013.01); *H01L 21/0243* (2013.01); *H01L 21/0251* (2013.01); *H01L 21/0254* (2013.01); *H01L 21/02389* (2013.01); *H01L 21/02433* (2013.01); *H01L 21/02458* (2013.01); *H01L 33/08* (2013.01); *H01L 33/12* (2013.01)

(58) Field of Classification Search
CPC .................................................. H01L 21/2015
See application file for complete search history.

(56) References Cited

U.S. PATENT DOCUMENTS

| 3,531,245 A | 9/1970 | Dietz |
| 3,600,701 A | 8/1971 | Gouldthorpe |
| 3,603,414 A | 9/1971 | Stebley |
| 3,607,014 A | 9/1971 | Huml et al. |
| 3,634,149 A | 1/1972 | Knippenberg et al. |
| 3,768,983 A | 10/1973 | Elkins et al. |
| 3,903,357 A | 9/1975 | Woolfson et al. |
| 3,933,573 A | 1/1976 | Dugger |
| 4,008,851 A | 2/1977 | Hirsch |
| 4,088,515 A | 5/1978 | Blakeslee et al. |
| 4,234,554 A | 11/1980 | Rabenau et al. |
| 4,547,471 A | 10/1985 | Huseby et al. |
| 5,070,393 A | 12/1991 | Nakagawa et al. |
| 5,087,949 A | 2/1992 | Haitz |
| 5,292,487 A | 3/1994 | Tatsumi et al. |

(Continued)

FOREIGN PATENT DOCUMENTS

| DE | 102 48 964 A1 | 4/2004 |
| EP | 0 609 799 A2 | 8/1994 |

(Continued)

OTHER PUBLICATIONS

Shih et al, J. Crystal Growth 277, (Feb. 10, 2005) pp. 44-50 "High-quality . . . method".*

(Continued)

*Primary Examiner* — Jerome Jackson, Jr.
(74) *Attorney, Agent, or Firm* — Morgan, Lewis & Bockius LLP (57) ABSTRACT Semiconductor structures are fabricated to include strained epitaxial layers exceeding a predicted critical thickness thereof.

28 Claims, 5 Drawing Sheets

(56) References Cited

U.S. PATENT DOCUMENTS

| | | |
|---|---|---|
| 5,312,698 A | 5/1994 | Sato et al. |
| 5,494,861 A | 2/1996 | Yamaga et al. |
| 5,520,785 A | 5/1996 | Evans et al. |
| 5,525,320 A | 6/1996 | Pratsinis et al. |
| 5,571,603 A | 11/1996 | Utumi et al. |
| 5,670,798 A | 9/1997 | Schetzina |
| 5,703,397 A | 12/1997 | Endo et al. |
| 5,728,635 A | 3/1998 | Kobayashi et al. |
| 5,858,085 A | 1/1999 | Arai et al. |
| 5,858,086 A | 1/1999 | Hunter |
| 5,868,837 A | 2/1999 | DiSalvo et al. |
| 5,909,036 A | 6/1999 | Tanaka et al. |
| 5,924,874 A | 7/1999 | Gotoh et al. |
| 5,954,874 A | 9/1999 | Hunter |
| 5,972,109 A | 10/1999 | Hunter |
| 5,981,980 A | 11/1999 | Miyajima et al. |
| 6,000,174 A | 12/1999 | Yamazaki et al. |
| 6,001,748 A | 12/1999 | Tanaka et al. |
| 6,006,620 A | 12/1999 | Lawrie et al. |
| 6,045,612 A | 4/2000 | Hunter |
| 6,048,813 A | 4/2000 | Hunter |
| 6,063,185 A | 5/2000 | Hunter |
| 6,066,205 A | 5/2000 | Hunter |
| 6,086,672 A | 7/2000 | Hunter |
| 6,091,085 A | 7/2000 | Lester |
| 6,187,089 B1 | 2/2001 | Phillips et al. |
| 6,211,089 B1 | 4/2001 | Kim et al. |
| 6,270,569 B1 | 8/2001 | Shibata et al. |
| 6,296,956 B1 | 10/2001 | Hunter |
| 6,398,867 B1 | 6/2002 | D'Evelyn et al. |
| 6,404,125 B1 | 6/2002 | Garbuzov et al. |
| 6,447,604 B1 | 9/2002 | Flynn et al. |
| 6,468,347 B1 | 10/2002 | Motoki et al. |
| 6,515,308 B1 | 2/2003 | Kneissl et al. |
| 6,548,405 B2 | 4/2003 | Kraus et al. |
| 6,592,663 B1 | 7/2003 | Sarayama et al. |
| 6,596,079 B1 | 7/2003 | Vaudo et al. |
| 6,719,843 B2 | 4/2004 | Schowalter et al. |
| 6,770,135 B2 | 8/2004 | Schowalter et al. |
| 6,777,717 B1 | 8/2004 | Karlicek |
| 6,791,119 B2 | 9/2004 | Slater, Jr. et al. |
| 6,831,302 B2 | 12/2004 | Erchak et al. |
| 6,840,431 B1 | 1/2005 | Kim |
| 6,861,729 B2 | 3/2005 | Kozaki et al. |
| 6,936,357 B2 | 8/2005 | Melnik et al. |
| 6,995,402 B2 | 2/2006 | Ludowise et al. |
| 7,026,659 B2 | 4/2006 | Slater, Jr. et al. |
| 7,037,738 B2 | 5/2006 | Sugiyama et al. |
| 7,037,838 B2 | 5/2006 | Schowalter et al. |
| 7,056,383 B2 | 6/2006 | Helava et al. |
| 7,063,741 B2 | 6/2006 | D'Evelyn et al. |
| 7,087,112 B1 | 8/2006 | Rojo et al. |
| 7,125,734 B2 | 10/2006 | Sackrison et al. |
| 7,186,580 B2 | 3/2007 | Tran et al. |
| 7,211,146 B2 | 5/2007 | Schowalter et al. |
| 7,211,831 B2 | 5/2007 | Erchak et al. |
| 7,244,520 B2 | 7/2007 | Kumakura et al. |
| 7,250,637 B2 | 7/2007 | Shimizu et al. |
| 7,274,043 B2 | 9/2007 | Erchak et al. |
| 7,276,779 B2 | 10/2007 | Shibata |
| 7,288,152 B2 | 10/2007 | Kitaoka et al. |
| 7,420,218 B2 | 9/2008 | Nagai |
| 7,420,222 B2 | 9/2008 | Slater, Jr. et al. |
| 7,439,552 B2 | 10/2008 | Takigawa et al. |
| 7,476,910 B2 | 1/2009 | Fujimoto et al. |
| 7,518,158 B2 | 4/2009 | Keller et al. |
| 7,524,376 B2 | 4/2009 | Wang |
| 7,554,128 B2 | 6/2009 | Okamoto et al. |
| 7,631,986 B2 | 12/2009 | Harrah |
| 7,638,346 B2 | 12/2009 | Schowalter et al. |
| 7,641,735 B2 | 1/2010 | Slack et al. |
| 7,674,699 B2 | 3/2010 | Shibata |
| 7,678,195 B2 | 3/2010 | Schlesser et al. |
| 7,713,844 B2 | 5/2010 | Nishiura et al. |
| 7,755,103 B2 | 7/2010 | Ueno |
| 7,776,153 B2 | 8/2010 | Schowalter |
| 7,803,733 B2 | 9/2010 | Teratani et al. |
| 2001/0000209 A1 | 4/2001 | Krames et al. |
| 2001/0024871 A1* | 9/2001 | Yagi ................. 438/604 |
| 2001/0051433 A1 | 12/2001 | Francis et al. |
| 2002/0170490 A1 | 11/2002 | Vodakov et al. |
| 2003/0047816 A1 | 3/2003 | Dutta |
| 2003/0160254 A1 | 8/2003 | Henrichs |
| 2003/0168003 A1 | 9/2003 | Schowalter et al. |
| 2003/0213964 A1* | 11/2003 | Flynn et al. ................. 257/85 |
| 2003/0216011 A1 | 11/2003 | Nakamura et al. |
| 2004/0033690 A1* | 2/2004 | Schowalter et al. .......... 438/689 |
| 2004/0104442 A1 | 6/2004 | Feudel et al. |
| 2004/0130002 A1 | 7/2004 | Weeks et al. |
| 2004/0187766 A1 | 9/2004 | Letertre |
| 2004/0206978 A1 | 10/2004 | Saxler |
| 2004/0213309 A9 | 10/2004 | Amano et al. |
| 2004/0224484 A1 | 11/2004 | Fareed et al. |
| 2004/0226917 A1 | 11/2004 | Laconto et al. |
| 2004/0245535 A1 | 12/2004 | D'Evelyn et al. |
| 2005/0062392 A1 | 3/2005 | Sakai et al. |
| 2005/0072986 A1 | 4/2005 | Sasaoka |
| 2005/0103257 A1 | 5/2005 | Xu et al. |
| 2005/0142391 A1 | 6/2005 | Dmitriev et al. |
| 2005/0161697 A1 | 7/2005 | Nakahata et al. |
| 2005/0164044 A1 | 7/2005 | Melnik et al. |
| 2005/0214992 A1 | 9/2005 | Chakraborty et al. |
| 2005/0269577 A1 | 12/2005 | Ueda et al. |
| 2005/0277214 A1 | 12/2005 | Uematsu et al. |
| 2005/0285141 A1 | 12/2005 | Piner et al. |
| 2006/0005763 A1 | 1/2006 | Schowalter et al. |
| 2006/0029832 A1 | 2/2006 | Xu et al. |
| 2006/0054075 A1 | 3/2006 | Dwilinski et al. |
| 2006/0244011 A1 | 11/2006 | Saxler |
| 2006/0255341 A1 | 11/2006 | Pinnington et al. |
| 2006/0281205 A1 | 12/2006 | Park |
| 2006/0288929 A1 | 12/2006 | Slack et al. |
| 2007/0018184 A1 | 1/2007 | Beeson et al. |
| 2007/0101932 A1 | 5/2007 | Schowalter et al. |
| 2007/0102721 A1 | 5/2007 | DenBaars et al. |
| 2007/0131160 A1 | 6/2007 | Slack et al. |
| 2007/0134827 A1 | 6/2007 | Bondokov et al. |
| 2007/0243653 A1 | 10/2007 | Morgan et al. |
| 2007/0257333 A1 | 11/2007 | Schlesser et al. |
| 2008/0012034 A1 | 1/2008 | Thielen et al. |
| 2008/0036038 A1 | 2/2008 | Hersee et al. |
| 2008/0054280 A1 | 3/2008 | Reginelli et al. |
| 2008/0121910 A1 | 5/2008 | Bergmann et al. |
| 2008/0135861 A1 | 6/2008 | Pokrovskiy et al. |
| 2008/0142817 A1 | 6/2008 | Ibbetson et al. |
| 2008/0144688 A1 | 6/2008 | Chua et al. |
| 2008/0149945 A1 | 6/2008 | Nagai |
| 2008/0149960 A1 | 6/2008 | Amo et al. |
| 2008/0157111 A1 | 7/2008 | Erchak et al. |
| 2008/0173887 A1 | 7/2008 | Baba et al. |
| 2008/0182092 A1 | 7/2008 | Bondokov et al. |
| 2008/0187016 A1 | 8/2008 | Schowalter et al. |
| 2008/0191225 A1 | 8/2008 | Medendorp |
| 2008/0251808 A1 | 10/2008 | Kususe et al. |
| 2008/0258165 A1 | 10/2008 | Zimmerman et al. |
| 2009/0008654 A1 | 1/2009 | Nagai |
| 2009/0014742 A1 | 1/2009 | Erchak |
| 2009/0039373 A1 | 2/2009 | Saito et al. |
| 2009/0050050 A1 | 2/2009 | Slack et al. |
| 2009/0065791 A1 | 3/2009 | Yen et al. |
| 2009/0078957 A1 | 3/2009 | Hoshina |
| 2009/0121246 A1 | 5/2009 | Denbaars et al. |
| 2009/0121250 A1 | 5/2009 | DenBaars et al. |
| 2009/0140279 A1 | 6/2009 | Zimmerman et al. |
| 2009/0141502 A1 | 6/2009 | Sonoda et al. |
| 2009/0155989 A1 | 6/2009 | Uematsu et al. |
| 2009/0159910 A1 | 6/2009 | Lin et al. |
| 2009/0166657 A1 | 7/2009 | Yamada et al. |
| 2009/0173958 A1 | 7/2009 | Chakraborty et al. |
| 2009/0233394 A1 | 9/2009 | Batres et al. |
| 2009/0239357 A1 | 9/2009 | Amano et al. |
| 2009/0256163 A1 | 10/2009 | Chakraborty |
| 2009/0261372 A1 | 10/2009 | Ueda |
| 2009/0267098 A1 | 10/2009 | Choi |

(56) References Cited

U.S. PATENT DOCUMENTS

| | | | |
|---|---|---|---|
| 2009/0278148 | A1 | 11/2009 | Nabekura et al. |
| 2009/0315054 | A1 | 12/2009 | Kim et al. |
| 2009/0321758 | A1 | 12/2009 | Liu et al. |
| 2009/0321771 | A1 | 12/2009 | Hattori et al. |
| 2010/0006870 | A1 | 1/2010 | Lee et al. |
| 2010/0012956 | A1 | 1/2010 | Yoo |
| 2010/0025717 | A1 | 2/2010 | Fujii et al. |
| 2010/0025719 | A1 | 2/2010 | Li |
| 2010/0135349 | A1 | 6/2010 | Schowalter et al. |
| 2010/0187541 | A1 | 7/2010 | Slack et al. |
| 2010/0264460 | A1 | 10/2010 | Grandusky et al. |
| 2010/0314551 | A1 | 12/2010 | Bettles et al. |
| 2011/0008621 | A1 | 1/2011 | Morgan et al. |
| 2011/0011332 | A1 | 1/2011 | Rojo et al. |

FOREIGN PATENT DOCUMENTS

| | | |
|---|---|---|
| EP | 0 811 708 | 12/1997 |
| EP | 0 979 883 | 2/2000 |
| EP | 1 211 715 | 6/2002 |
| EP | 1 732 145 A2 | 12/2006 |
| EP | 1 754 810 A1 | 2/2007 |
| EP | 2 099 068 | 9/2009 |
| JP | 61-236686 | 10/1986 |
| JP | 02-018379 A | 1/1990 |
| JP | 03-285075 | 12/1991 |
| JP | 04-355920 A | 12/1992 |
| JP | 2000-154090 | 6/2000 |
| JP | 2001-192647 | 7/2001 |
| JP | 06/169173 | 6/2006 |
| WO | WO-99/34037 A1 | 7/1999 |
| WO | WO-00-22203 | 4/2000 |
| WO | WO-01/11116 A1 | 2/2001 |
| WO | WO-03-007383 | 1/2003 |
| WO | WO-03-081730 A2 | 10/2003 |
| WO | WO-2005-012602 A1 | 2/2005 |
| WO | WO-2006-110512 A1 | 10/2006 |
| WO | WO-2007-062250 A2 | 5/2007 |
| WO | WO-2008-042020 A2 | 4/2008 |

OTHER PUBLICATIONS

Bennett et al, "High Quality . . . Beyond the Matthews-Blakeslee Critical Layer Thickness", 4th Annual Conf. on InP and Related Materials, Newport R.I. Apr. 1992 pp. 650-653.*

Katayama-Yoshida et al., "Codoping method for the Fabrication of Low-Resistivity Wide Band-Gap Semiconductors in p-type GaN, p-type AlN and n-type Diamond: Prediction versus Experiment," 13 J. of Physics: Condensed Matter, pp. 8901-8914 (2001).

Office Action in Australian Patent Application No. 2003303485, Oct. 9, 2008, 2 pages.

Office Action in Canadian Patent Application No. 2,467,806, Aug. 13, 2009, 4 pages.

Office Action in Canadian Patent Application No. 2,467,806, Feb. 23, 2010, 2 pages.

Office Action in European Patent Application No. 02803675.4, May 2, 2007, 4 pages.

Office Action in European Patent Application No. 02806723.9, Feb. 7, 2007, 4 pages.

Office Action in European Patent Application No. 02806723.9, Jan. 17, 2008, 4 pages.

Office Action in European Patent Application No. 02806723.9, dated Feb. 16, 2010 (2 pages).

Office Action in European Patent Application No. 03808366.3, dated Sep. 28, 2006, 4 pages.

Office Action in European Patent Application No. 06844804.2, Mar. 4, 2009, 3 pages.

Office Action in Japanese Patent Application No. 2003-579324, Sep. 8, 2009, 1 page (translation).

Office Action in Japanese Patent Application No. 2003-545445, mailed Nov. 10, 2009, 3 pages (translation).

Office Action in Japanese Patent Application No. 2003-545445, mailed Sep. 30, 2008, 3 pages (translation).

Office Action in Japanese Patent Application No. 2004-564684, Jun. 24, 2009, 2 pages (translation).

Office Action in Japanese Patent Application No. 2004-564684, Feb. 3, 2010, 2 pages (translation).

Office Action in Taiwan Patent Application No. 91137050, Apr. 6, 2004, 1 page (translation).

Summons to Attend Oral Proceedings in European Patent Application No. 03808366.3, Dec. 17, 2007, 5 pages.

Wongchotigul et al., "Low Resistivity Aluminum Nitride:Carbon (AlN:C) Films Grown by Metal Organic Chemical Vapor Deposition," 26 Materials Letters, pp. 223-226 (Mar. 1996).

Arulkumaran et al., "Improved dc characteristics of AlGaN/GaN high-electron-mobility transistors on AlN/sapphire templates," (2002) *Applied Physics Letters*, vol. 81, No. 6, pp. 1131-1133.

Balkas et al., "Sublimation Growth and Characterizations of Bulk Aluminum Nitride Single Crystals," *J. Crystal Growth*, (1997) 179, p. 363.

Barin, *Thermochemical Data of Pure Substances*, 2nd Ed., (1993) pp. 42, 1334-1335, 1337, 1381-1382, 1636-1639.

Bockowski et al., "Combustion Synthesis of Aluminum Nitride Under High Pressure of Nitrogen and Nitrogen-Argon Mixtures," 5 *J. Mat. Synthesis & Processing 6*, (1997) pp. 449-458.

Bolgar et al., "Vaporization of the Nitirides of B, Al, and Ga," in *Khim Fiz. Nitrodov*, pp. 151-156 (1968) [Chem Abstr. 71, 34003j (1969)].

Chase et al., *J. Phys. Chem. Ref.* Data 14, Supplement No. 1 (1985).

Chase, *J. Phys. Chem.*, Ref. Data, Monograph No. 9, NIST-JANAF Thermochemical Tables, 4th Ed. (1998).

Chitnis et al., "Milliwatt Power AlGaN Quantum Well Deep Ultraviolet Light Emitting Diodes," *Phys. Sat. Sol.* (a), (2003) 200, No. 1, pp. 99-101.

Constantin et al., "Mixing rocksalt and wurtzite structure binary nitrides to form novel ternary alloys: ScGaN and MnGaN," *Mat. Res. Soc. Symp. Proc.*, 799 (2004) Z9.5.1.

Cox et al., "On the Preparation, Optical Properties and Electrical Behaviour of Aluminum Nitride," *J. Phys. Chem. Solids*, (1967) vol. 28, pp. 543-548.

Dalmau et al., *Mat. Res. Soc. Proc.*, (2004) vol. 798, p. Y2.9.1.

DeVries et al., "Phase equilibria pertinent to the growth of cubic boron nitride," *J. Cryst. Growth*, 13/14 (1972) 88.

Dryburgh, "The Estimation of Maximum Growth Rate for Aluminum Nitride Crystals by Direct Sublimation," *J. Crystal Growth*, (1992) 125, pp. 65-68.

Dugger, "The single crystal synthesis and some properties of Aluminum Nitride", Air Force Cambridge Research Laboratories, Physical Science Research Papers, No. 656 (Aug. 1, 1975).

Dugger, The synthesis of Aluminum Nitride single crystals:, *Mat. Res. Bulletin*, 9 (1974) 331.

Epelbaum et al., "Sublimation growth of bulk AlN crystals: materials compatibility and crystal quality," *Mat. Sci. Forum*, (2002) 389-393, 1445.

Gorbatov et al., "Electrical Conductivity of Materials from Mixed Aluminum and Silicon Nitrides," *Sov. Powd. Met. Met. Ceram.*, (1970) vol. 9, pp. 917-920.

Hacke et al., "Photoluminescence Intensity and Spectral Distribution of GaN Films on SiC," *Phys. Stat. Sol.* (b), (1991) 216, 639.

Hermann et al., "Highly Si-doped AlN Grown by Plasma-Assisted Molecular-Beam Epitaxy," *Applied Phys. Letters*, (2005) vol. 86, pp. 192108-1-192108-3.

Honig, "Vapor Pressure Data for the Solid and Liquid Elements", *RCA Review*, vol. 23 (1962) 567.

International Preliminary Report on Patentability and Written Opinion for PCT/US2006/022329, issued Dec. 11, 2007.

International Preliminary Report on Patentability and Written Opinion for PCT/US2006/045540, issued Jun. 3, 2008.

International Preliminary Report on Patentability and Written Opinion for PCT/US2007/011075, issued Nov. 11, 2008.

International Preliminary Report on Patentability and Written Opinion for PCT/US2006/046300, issued Jun. 4, 2008.

International Search Report and Written Opinion for PCT/US2007/011075, mailed Jul. 11, 2008.

(56) References Cited

OTHER PUBLICATIONS

International Search Report and Written Opinion for PCT/US2007/07980, mailed Oct. 12, 2007.
International Search Report and Written Opinion for PCT/US2008/000597, mailed May 20, 2008.
International Search Report and Written Opinion for PCT/US2008/001003, mailed Aug. 5, 2008.
International Search Report for PCT/US2006/022329, mailed Dec. 12, 2006.
International Search Report for PCT/US2006/045540, mailed Jul. 6, 2007.
International Search Report for PCT/US2006/046300, mailed May 30, 2007.
Kanechika et al., "n-type AlN Layer by Si Ion Implantation," *Applied Phys. Letters*, (2006) vol. 88, p. 202106.
Karel et al., "The luminescence properties of AlN with Manganese and rare earth activators under ultraviolet and cathode-ray excitation", *Czech. J. Phys.*, B20 (1970) 46.
Karpinski et al., "Equilibrium pressure of $N_2$ over GaN and high pressure solution growth of GaN", *J. Cryst. Growth*, 66 (1984) 1.
Kasu et al., "Formation of Solid Solution of Al1—xSixN (0<x?12%) Ternary Alloy," *Jap. J. Appl. Phys.*, (2001) vol. 40, Part 2, No. 10A, pp. L1048-L1050.
Kawabe et al., "Electrical and Optical Properties of AlN-a Thermostable Semiconductor," *Elec. Engin. In Japan*, (1967) vol. 87, pp. 62-70.
Khan "AlGaN Based Deep Ultraviolet Light Emitting Diodes with Emission from 250-280 nm.," Abstract and Presentation at the Int'l. Workshop on Nitride Semicond., Pittsburg, PA, Jul. 19, 2004.
Kordis, "The BeO—MgO system", *J. Nuc. Mater.*, 14 (1964) 322.
Lawson et al., "Preparation of Single Crystals", Academic Press, New York (1958) pp. 18-20.
Liu et al., "A Global Growth Rate Model for Aluminum Nitride Sublimation," *J. Electrochemical. Soc.*, (2002) 149, p. G12.
Liu et al., "Characterization of AlN Crystals Grown by Sublimation," *Phys. Stat. Sol.* (a), (2001) 188, p. 769.
Ludwig et al., "Dimers $[Al_2N_4]$", *Zeitsch. f. Naturforsch.*, B54 (1999) pp. 461-465.
Mokhov et al., "Sublimation growth of AlN bulk crystals in Ta crucibles," *Jrl. of Crys. Growth*, (Jul. 15, 2005) vol. 281, No. 1, pp. 93-100.
Naidu et al., Eds. "Phase Diagrams of Binary Tungsten Alloys," Indian Institute of Metals, Calcutta, pp. 7-13 (1991).
Nakanishi et al., "Effects of Al Composition on luminescence properties of europim implanted $Al_xGa_{1-x}N$ (0<x<1)", *Phys. Stat. Sol.* (c), 0 (2003) 2623.
Nassau et al., "The Physics and Chemistry of Color," Wiley-Interscience Publication (New York 1983).
Niewa et al., "$Li_3[ScN_2]$: The first nitridoscandate (III)—Tetrahedral Sc Coordination and unusual $MX_2$ framework", *Chem. Eur. J.* 9 (2003) 4255.
Niewa et al., "Recent developments in nitride chemistry", *Chem. Mater.*, 10 (1998) 2733.
Noveski et al., "Growth of AlN Crystals on AlN/SiC Seeds by AlN Powder Sublimation in Nitrogen Atmosphere," *MRS Internet J. Nitride Semicond. Res.*, (2004) 9, 2.
Office Action in Japanese Patent Application No. 2003-579324, May 27, 2008 (English Translation).
Proc. of Nato Advanced Study Inst. on Nitrogen Ceramics, University of Kent, Canterbury, U.K. (1976).
Raghothamachar et al., "Synchrotron White Beam Topography Characterization of Physical Vapor Transport Grown AlN and Ammonothermal GaN," *J. Crystal Growth*, (2002) 246, pp. 271-280.
Raghothamachar et al., "X-ray Characterization of Bulk AlN Single Crystals Grown by the Sublimation Technique," *J. Crystal Growth*, (2003) 250(1-2), pp. 244-250.
Rojo et al., "Growth and Characterization of Epitaxial Layers on Aluminum Nitride Substrates Prepared from Bulk, Single Crystals," *J. Crystal Growth*, (2002) 240, p. 508.
Rojo et al., "Progress in the Preparation of Aluminum Nitride Substrates from Bulk Crystals," *Mat. Res. Soc. Symp. Proc.*, (2002) 722, pp. 5-13.
Rojo et al., "Report on the Growth of Bulk Aluminum Nitride and Subsequent Substrate Preparation," *J. Crystal Growth*, (2001) 231, p. 317.
Schlesser et al., "Growth of AlN Bulk Crystals from the Vapor Phase," *Mat. Res. Soc. Symp. Proc.*, (2002) 693, p. I9.4.1.
Schlesser et al., "Seeded Growth of AlN Bulk Single Srystals by Sublimation," *J. Crystal. Growth*, 241, pp. 416-420.
Schowalter et al., "Fabrication of Native, Single-Crystal AlN Substrates," *Phys. Stat. Sol.* (c), (2003) 1-4.
Segal et al., "On Mechanisms of Sublimination Growth of AlN bulk Crystals," *J. Crystal Gowth*, (2000) 211, pp. 68-72.
Shih et al, "High-quality and crack-free $Al_xGa_{1-x}N$ (x-0.2) grown on sapphire by a two-step growth method," *Jrl. of Crys. Growth*, (Apr. 15, 2005) vol. 277, No. 1-4, pp. 44-50.
Silveira et al., "Excitonic Structure of Bulk AlN from Optical Reflectivity and Cathodoluminescense Measurements," *Phys. Review* B71, 041201® (2006).
Singh et al., "Physical Vapor Transport Growth of Large AlN Crystals," *J. Cryst. Growth*, (2003) 250, p. 107.
Slack et al., "AlN Single Crystals," *J. Crystal Growth*, (1977) 42, pp. 560-563.
Slack et al., "Growth of High Purity AlN Crystals," *J. Crystal Growth*, (1976) 34, pp. 263-279.
Slack et al., "Properties of Crucible Materials for Bulk Growth of AlN," *Mat. Res. Soc. Proc.*, (2004) vol. 798, pp. Y10.74.1-Y10.74.4.
Slack et al., "Some Effects of Oxygen Impurities on AlN and GaN," *J. Crystal Growth*, (2002) 246, pp. 287-298.
Smart et al., "AlGaN/GaN Heterostructures on Insulating AlGaN Nucleation Layers," *Appl. Phys. Letters*, (1999) 75, p. 388.
Sun et al., "Phase relationships in the system Y—Al—O—N", *Mater. Letters*, 3-4 (1991) 76.
Takeya et al., "Degradation in AlGaInN Lasers," *Phys. Stat. Sol.* (c), (2003) 0, No. 7, pp. 2292-2295.
Taniyasu et al., "An aluminum nitride light-emitting diode with a wavelength of 210 nanometres", *Nature*, 441 (2006) 325.
Taniyasu et al., "Intentional control of n-type conduction for Si-doped AlN and $Al_xGa_{1-x}N$ (0.42<x <1)", *Applied Physics Letters*, 81 (2002) 1255.
Tavernier et al., "Chemical Mechanical Polishing of Gallium Nitride," *Electrochemical and Solid State Latters*, (2002) vol. 5, No. 8, pp. G61-G64.
Tomiya et al., "Dislocations in GaN-Based Laser Diodes on Epitaxial Lateral Overgrown GaN Layers," *Phys. Stat. Sol.* (a), (2001) vol. 188, No. 1, pp. 69-72.
Tsao, "Solid-State Lighting: Lamps, Chips and Materials for Tomorrow," *IEEE Circuits and Devices Magazine*, (2004) 20, pp. 28-37.
Van de Walle et al., "Doping of AlGaN Alloys," *MRS Internet J. Nitride Semicond. Res.*, (1999) 4S1, G10.4, pp. 1-12.
Van de Walle et al., "DX-center Formation in Wurtzite and Zinc-blende AlxGa1—xN," *Phys. Rev.*, (1998) B57, R2033.
Vendl et al., "The melting points of some rare-earth metal nitrides as function of the nitrogen ressure", *High Temperatures—High Pressures*, 9 (1977) 313.
Venugopal et al., "Comparison of Various Buffer Schemes to Grow GaN on Large-Area Si(111) Substrates Using Metal-Organic Chemical-Vapor Deposition," *32 J. Electronic Mat.*, vol. 32, No. 5 (2003) pp. 371-374.
Vinogradov, "Determination of the Melting Parameters of Aluminum Nitride," *High Temperatures—High Pressures*, (1991) vol. 23, pp. 685-688.
Wentorf Jr., "Synthesis of the cubic form of boron nitride", *J. Chem. Phys.*, 34 (1961) 809.
Yamane et al., "Preparation of GaN single crystals using a Na flux", *Chem. Mater.*, 9 (1997) 413.
Yano et al., "Growth of nitride crystals, BN AlN and GaN by using a Na flux", *Diamond and Related Materials*, 9 (2000) 512.
Yu et al., "Sublimation Growth of AlN in Vacuum and in a Gas Atmosphere," *Phys. Stat. Sol.* (a), (1999) 176, p. 435.

(56) References Cited

OTHER PUBLICATIONS

Zeisel et al., "DX-behavior of Si in AlN," *Phys. Rev.*, (2000) B61, R16283.
Zhuang et al., "Seeded growth of AlN single crystals by physical vapor transport," *Jrl. of Crys. Growth*, (Jan. 25, 2006), vol. 287, No. 2, pp. 372-375.
Jahnen et al., "Pinholes, Dislocations adn Strain Relaxation in InGaN", *MRS Internet J. Nitride Semicond. Res.*, 3:39 (1998).
Liu et al., "Misfit Dislocation Generation in InGaN Epilayers on Free-Standing GaN", *Jpn. J. Appl. Phys.*, 46:22 (2006), pp. L549-L551.
Matthews et al., "Defects in Epitaxial Multilayers", *Journal of Crystal Growth*, 27, 118 (1974).
Parker et al., "Determination of the critical layer thickness in the InGaN/GaN heterostructures", *Appl. Phys. Ltrs.*, 75: 18 (Nov. 1, 1999) pp. 2776-2778.
Solid State Lighting Report (Dept. of Energy, 2007).
Song, "Strain relaxation due to V-pit formation in $In_xGa_{1-x}N/GaN$ epilayers grown on sapphire", *J. Appl. Phys.*, 98: 084906 (2005).
Takeuchi et al., "Optical Properties of Strained AlGaN and GaInN on GaN", *Jpn. J. Appl. Phys.*, vol. 36 (1997) pp. L177-L179.
International Preliminary Report on Patentability and Written Opinion for PCT/US2008/000597, mailed Jul. 30, 2009.
International Preliminary Report on Patentability and Written Opinion for PCT/US2008/001003, mailed Aug. 6, 2009.
Bickermann et al., "Characterization of bulk AlN with low oxygen content," *Jrl. of Crys. Growth*, vol. 269, Nos. 2-4, pp. 432-442.
Noveski et al., "Mass Transfer in AlN Crystal Growth at High Temperatures," *J. Crystal Growth*, (2004) 264, pp. 369-378.
Office Action in European Patent Application No. 02806723.9, Aug. 8, 2008, 3 pages.
Partial International Search Report for International Application No. PCT/US07/11075, dated May 7, 2008 (2 pages).
Atobe—JJAP, 29, 150, 1990—F-Type Centers in Neutron-Irradiated AlN.
Berzina-RadEFF 157, 1089, 2002—Luminescence mechanisms of O-related defects in AlN.
Bickermann et al., "Point Defect Content and Optical Transitions in Bulk Aluminum Nitride Crystals," Phys. Stat. Sol. B 246, No. 6, pp. 1181-1183 (2009).
Bickerman pssc 0, 1993-1996, 2003—PVT growth of bulk AlN.
Bickerman—APL,103,073522, 2008—Polarization dependent below BG optical absorption of AlN bulk crystals.
Bradley—JVacSciTechB 21, 2558, 2003—Deep level defects and doping in high Al mole fraction AlGaN.
Brunner—JAppPhys 82, 5090, 1997—Optical constants of epitaxial AlGaN films and their temperature dependence.
Collins—PRB 158, 833, 1967—Lattice vibration spectra of AlN.
Edgar—JCrGrwth 310, 4002, 2008—Native oxide and hydroxides and their implications for bulk AlN crystal growth.
Evans—APL 88, 06112, 2006—EPR of a donor in AlN crystals.
Freitas—pssb 240, 330, 2003—Shallow donors in GaN.
Freitas—APL 83, 2584,2003—Properties of bulk AlN grown by thermodecomposition of $AlCl3$—$NH3$.
Freitas—JCrGrwth 281, 168, 2005—Optical studies of bulk and homoepitaxial films of III-V nitride semiconductors.
Gutierrez—Phil.Mag.Let. 79, 147, 1999—The formation of nanopipes caused by donor impurities in GaN; a theoretical study for the case of oxygen.
Honda—JJAP 29, L652, 1990—Electron paramagnetic center in neutron-irradiated AlN.
Hossain—SPIE 2877, 42, 1996—Study of CL spectroscopy of AlN.
Jones—JMR 14, 4344, 1999—Optical properties of AlN from VUS and ellipsometry.

Kazan-Diamond15, 1525, 2006—Phonon dynamics in AlN lattice contaminated by O.
Kazan—JAP, 98, 103529,2005—Oxygen behavior in AlN.
Klemens—PhysB, 316-317,413, 2002—Effect of point defects on the decay of the longitudinal optical mode.
Mason—PRB 59, 1937, 1999—Optically detected EPR of AlN single crystals.
McCluskey—PRL 80 4008 1998—Metastability of oxygen donors in AlGaN.
Morita—JJAP 21, 1102, 1982—Optical absorption and CL of epitaxial AlN films.
Nakahata—JAmCerSoc 80, 1612, 1997—Electron spin resonance analysis of lattice defects in poly AlN.
Nakarmi—APL 94, 091903, 2009—PL studies of impurity transitions Mg-doped AlGaN alloys.
Nam—APL 86, 222108, 2005—Deep Impurity transitions involving cation vacancies and complexes in AlGaN alloys.
Nepal—APL 84, 1091, 2004—Optical properties of the nitrogen vacancyin AlN epilayers.
Nepal—APL 89, 092107, 2006—Photoluminescene studies of impurity transitions in AlGaN alloys.
Pantha—APL 91, 121117, 2007—Correlation between biaxial stress and free exciton transition in AlN.
Perry and Rutz—APL 33, p. 319, 1978—The optical absorption edge of single-crystal AlN prepared by a closed-spaced vapor process.
Salzman—pssc 0, 2541, 2003—Reduction of oxygen contamination in AlN.
Sarua—MRS 798, Y17.1, 2004—Effect of impurities on Raman and PL spectra of AlN bulk crystals.
Schlesser—JCrGrwth 281, 75, 2005—Crucible materials for growth of aluminum nitride crystals.
Schweizer—ppsb 219, 171, 2000—Investigation of oxygen-related luminescence centres in AlN ceramic.
Sedhain—APL 93, 014905, 2008—Photoluminescence properties of AlN homeopilayers with different orientations.
Shi—APL89, 163127, 2006—Luminescence properties of AlN nanotips.
Stampfl—PRB 65, 155212, 2002—Theoretical investigation of native defects, impurities and complexes in aluminum nitride.
Strassburg—JAP 96, 5870,2004—Growth and optical properties of large high quality AlN single crystals.
Thomas—J.Eur.Cer.Soc. 1991—Determination of the concentration of oxygen dissolved in the AlN lattice.
Trinkler—JphysCondMatt 13, 8931, 2001—Radiation induced recombination processes in AlN ceramics.
Trinkler—RadiationMeasurements 33, 731, 2001—Stimulated luminescence of AlN ceramics induced by UV radiation.
Trinkler—SPIE 2967, 85, 1997—Spectral properties of AlN ceramics.
Tuomisto—JCrGrwth 2008—Characterization of bulk AlN crystals with position annihilation spectroscopy.
Vail—JPhysCondMat18,21225, 2006—The nitrogen vacancy in AlN.
Van de Walle—AppPhysRev 95,3852 2004—First principles calculations for defects and impurities—Application s to iii-nitrides.
Watanabe—JMR13,2956,1998—Changes in optical transmittance and surface morphology of AlN thin films exposed to atmosphere.
Gaska et al., "Deep-Ultraviolet Emission of AlGaN/AlN Quantum Wells on Bulk AlN," Applied Physics Letters, vol. 81, No. 24, pp. 4658-4660 (Dec. 9, 2002).
Office Action in Chinese Patent Application No. 200680045153.1, Oct. 13, 2010, 4 pages (translation).
Office Action in Chinese Patent Application No. 200780018103.9, Apr. 6, 2011, 6 pages (translation).

* cited by examiner

THICK PSEUDOMORPHIC NITRIDE EPITAXIAL LAYERS

RELATED APPLICATIONS

This application claims the benefit of and priority to U.S. Provisional Application Ser. No. 60/897,572, filed Jan. 26, 2007, the entire disclosure of which is hereby incorporated by reference.

FIELD OF THE INVENTION

The technology disclosed herein relates generally to lattice-mismatched semiconductor heterostructures, in particular pseudomorphic layers having a thickness greater than the critical thickness predicted therefor.

BACKGROUND

Achieving low defect densities throughout a semiconductor active device layer is important for the fabrication of a commercially practical nitride-based semiconductor device. As described in U.S. patent application Ser. No. 11/503,660 ("the '660 application"), the entire disclosure of which is hereby incorporated by reference, it is possible to form large-diameter, low-defect-density AlN substrates. However, many desirable device applications preferably incorporate device layers based on alloys of AlN, GaN, and InN to be grown on the AlN substrate. As the concentration of GaN and InN is increased, the lattice mismatch with respect to the AlN substrate also increases. For instance, the lattice parameter in the c-plane of GaN is approximately 2.4% larger than that of AlN. When a lattice-mismatched layer is epitaxially grown on a substrate, the initial layer typically grows pseudomorphically—that is, the epitaxial layer will be compressed (experience compressive strain) in the plane of the substrate surface if the intrinsic lattice parameter of the substrate is smaller than that of the epitaxial layer. The epitaxial layer will be stretched or put under tensile strain when the intrinsic lattice parameter of the epitaxial layer is smaller than that of the substrate. However, as the thickness of the epitaxial layer is increased, the strain energy in the epitaxial layer will grow and, typically, the layer will find some way to reduce the strain energy. This may occur by plastic flow through the motion of dislocations, through the creation of surface morphological features which allow strain relaxation, or, particularly when the strain is tensile, through cracking of the film.

Pseudomorphic layers are attractive for at least two reasons. The first is that when an epitaxial layer is grown on a low-dislocation substrate, the pseudomorphic epitaxial layer may also be grown with very low dislocation densities, often with the same dislocation density as the substrate. The second advantage accrues from the ability to tailor the band structure through the large resulting biaxial strains. For example, the strain can be used to break the degeneracy between heavy and light carrier bands and, as a result, obtain higher carrier mobilities.

SUMMARY

A technique is provided for growing very thick pseudomorphic films of alloys of AlN, GaN, and InN on high-quality AlN substrates. A pseudomorphic film is one where the strain parallel to the interface is approximately that needed to distort the lattice in the film to match that of the substrate. Thus, the parallel strain in a pseudomorphic film will be nearly or approximately equal to the difference in lattice parameters between an unstrained substrate parallel to the interface and an unstrained epitaxial layer parallel to the interface. As used herein, "very thick" refers to a thickness of the epitaxial layer that substantially exceeds (by a factor of at least 5 for substantially In-free layers or by a factor of at least 10 for layers including In) the expected critical thickness for the epitaxial film based on standard calculations of the thickness where strain relaxation should start to occur through the nucleation and/or motion of threading dislocations (or energy equilibrium calculations). The expected critical thickness may be calculated as described in, e.g., Matthews and Blakeslee, J. Crystal Growth 27, 118 (1974), and/or U.S. Pat. No. 4,088,515, the entire disclosure of each being hereby incorporated by reference, i.e., the predicted critical thickness may be calculated as $$h_c = \frac{b}{8\pi f} \frac{(1 - \nu\cos^2\alpha)}{(1 + \nu)\cos\lambda}\left(\ln\left(\frac{h_c}{b}\right) + 1\right),$$

where $h_c$ is the predicted critical thickness, b is the magnitude of the Burgers vector of a dislocation formed between the layer and the substrate, f is the lattice mismatch between the layer and the substrate, $\nu$ is the Poisson's ratio of the layer, $\lambda$ is the angle between the slip direction of the layer and the direction in the plane of the layer perpendicular to the line of intersection of the slip plane of the layer and the interface between the layer and the substrate, and $\alpha$ is the angle between the dislocation and the Burgers vector of the dislocation.

In one aspect, embodiments of the invention feature a semiconductor heterostructure including an aluminum nitride single-crystal substrate and at least one strained layer epitaxially grown thereover. The strained layer includes at least one of AlN, GaN, InN, or any binary or tertiary alloy combination thereof. The thickness of the strained layer exceeds the predicted critical thickness associated therewith by at least a factor of 5, or even by at least a factor of 10. The strained layer may be substantially In-free and/or have a density of macroscopic defects less than approximately 1 $mm^{-2}$. In an embodiment, the density of macroscopic defects is approximately 0 $mm^{-2}$.

Embodiments of the invention may include one or more of the following. The strain parallel to the strained layer is greater than 80% of a difference between the parallel lattice parameters of an unstrained alloy of the same composition as the strained layer and the relaxed platform disposed beneath the strained layer. The strain parallel to the strained layer may even be approximately 95%-100% of this difference. The relaxed platform may be either the substrate or a relaxed semiconductor layer formed between the substrate and the strained layer. The strained layer may include $Al_xGa_{1-x}N$, have a thickness greater than approximately 200 nm, and have an Al content x less than approximately 0.65. The thickness of the strained layer may be greater than approximately 1 µm, and the average threading dislocation density of the strained layer may be less than approximately 10,000 $cm^{-2}$. The predicted critical thickness may be calculated with the Matthews-Blakeslee theory.

In another aspect, embodiments of the invention feature a method of forming a semiconductor structure including providing an aluminum nitride single-crystal substrate and epitaxially depositing thereover a strained layer. The strained layer includes at least one of AlN, GaN, InN, or any binary or tertiary alloy combination thereof. The thickness of the strained layer exceeds the predicted critical thickness associated therewith by at least a factor of 5, or even by at least a factor of 10. The strained layer may be substantially In-free and/or have a density of macroscopic defects less than approximately 1 mm$^{-2}$. In an embodiment, the density of macroscopic defects is approximately 0 mm$^{-2}$.

Embodiments of the invention may include one or more of the following. A buffer layer may be formed over the substrate prior to depositing the strained layer, and a graded layer may be formed between the buffer layer and the strained layer. The strained layer may include AlGaN, and depositing the strained layer may include introducing trimethylaluminum and trimethylgallium into a reactor. The initial flow rate of trimethylgallium during the deposition of the strained layer may be lower than a final trimethylgallium flow rate. The predicted critical thickness may be calculated with the Matthews-Blakeslee theory. The aluminum nitride single-crystal substrate may have an RMS surface roughness less than approximately 0.5 nm for a 10 μm×10 μm area, a surface misorientation between approximately 0.3° and 4°, and a threading dislocation density less than approximately 10$^4$ cm$^{-2}$. The threading dislocation density of the strained layer may be approximately equal to the threading dislocation density of the aluminum nitride single-crystal substrate.

In yet another aspect, embodiments of the invention feature a device selected from the group consisting of a field effect transistor, a light-emitting diode, and a laser diode, the device including at least a portion of the strained heterostructure described above. The device may be a light-emitting diode having at least one interdigitated contact.

In another aspect, embodiments of the invention feature a device selected from the group consisting of a field effect transistor, a light-emitting diode, and a laser diode, the device including at least a portion of a strained heterostructure. The strained heterostructure includes an aluminum nitride single-crystal substrate and a plurality of strained layers epitaxially grown thereover. Each of the plurality of the strained layers includes at least one of AlN, GaN, InN, or any binary or tertiary alloy combination thereof. The total thickness of the plurality of strained layers exceeds the predicted critical thickness associated therewith by at least a factor of 5, or even by at least a factor of 10. The lattice parameter parallel to the surface of the aluminum nitride single-crystal substrate of each of the plurality of strained layers may be different from the lattice parameter of the aluminum nitride single-crystal substrate by less than 0.2%. One or more of the plurality of strained layers (including all of the layers) may be In-free.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Fabrication Techniques

Figure 1:
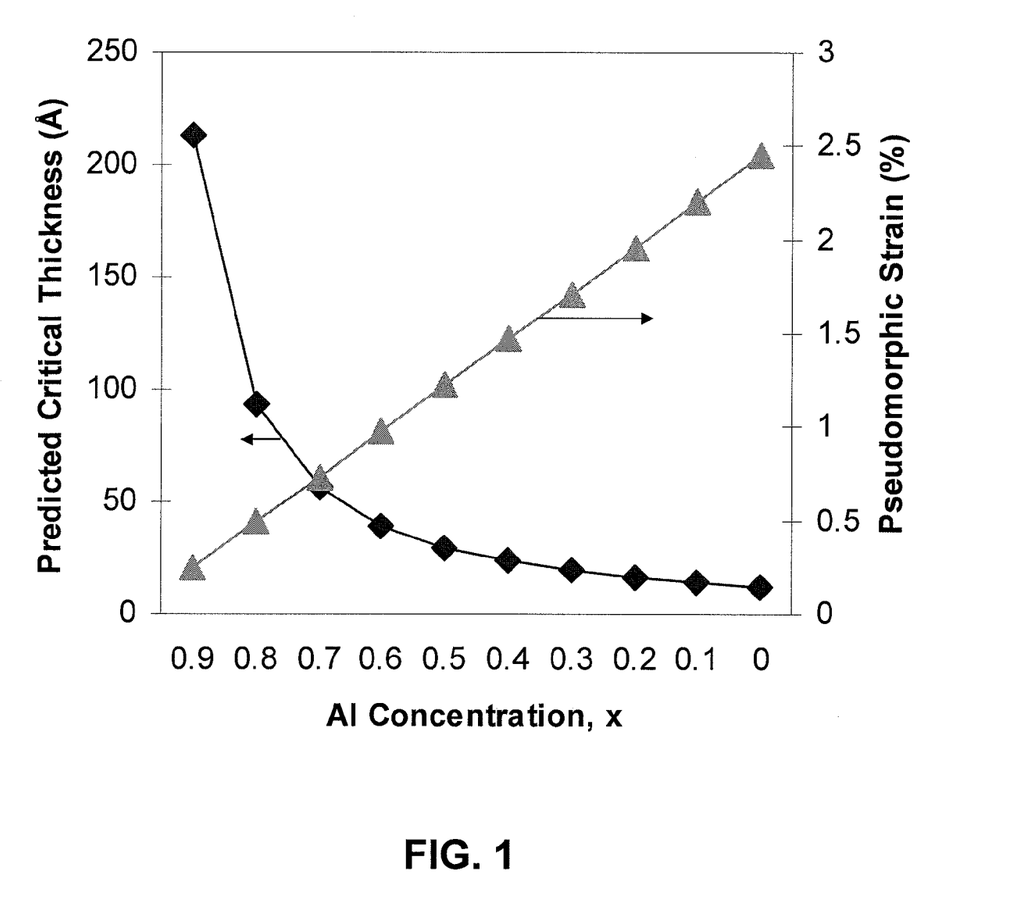
FIG. 1 is a graph of predicted critical thickness and pseudomorphic strain for Al$_x$Ga$_{1-x}$N layers of various Al contents x formed on AlN substrates.

The predicted critical thickness, calculated in accordance with the Matthews-Blakeslee theory as a function of Al concentration in Al$_x$Ga$_{1-x}$N layer growth on a c-face AlN substrate, is shown in FIG. 1. Also shown is the pseudomorphic strain of the Al$_x$Ga$_{1-x}$N layers attained in the absence of relaxation. Unexpectedly, we have found that it is possible to grow pseudomorphic layers with thicknesses much greater than the predicted critical thickness. For example, the critical thickness of an Al$_x$Ga$_{1-x}$N layer with x=0.6 is about 4 nanometers (nm), as shown in FIG. 1. We have been able to grow layers with this Al concentration to a thickness exceeding 1 micrometer (μm) and still obtain a pseudomorphically strained layer that is of very high quality and mirror smooth. As used herein, the term "high quality" refers to epitaxial layers having a threading dislocation density of approximately 10$^6$ cm$^{-2}$ or less. In certain embodiments, high-quality layers have threading dislocation densities of approximately 10$^4$ cm$^{-2}$ or less, or even approximately 10$^2$ cm$^{-2}$ or less. The term "pseudomorphic" is utilized herein to refer to epitaxial layers strained to at least approximately 80% of a lattice parameter of an underlying substrate (i.e., less than approximately 20% relaxed to its innate lattice parameter). In some embodiments, a pseudomorphic layer may be approximately fully strained to the lattice parameter of the underlying substrate. The term "mirror smooth" refers to layer root-mean-squared ("RMS") surface roughnesses less than approximately 5 nm in a 5 μm×5 μm area (as measured by an atomic-force microscope). In preferred embodiments the RMS surface roughness is less than approximately 1 nm in a 5 μm×5 μm area.

Figure 2:
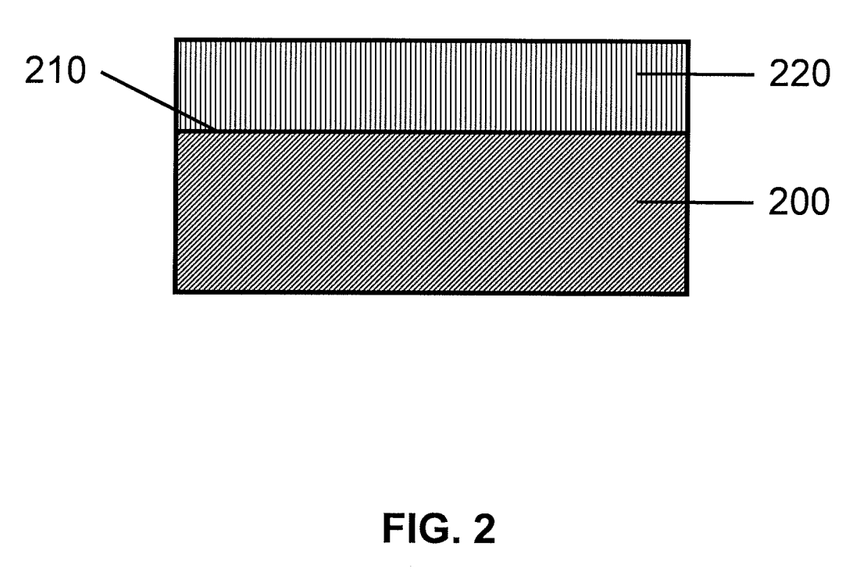
FIG. 2 is a schematic depicting a pseudomorphic strained layer formed on a substrate.

A thick pseudomorphic semiconductor layer fabricated in accordance herewith is shown in FIG. 2. A semiconductor substrate 200 is provided. In an embodiment, semiconductor substrate 200 includes or consists essentially of AlN. The top surface 210 of semiconductor substrate 200 may be prepared for epitaxial growth by at least one of planarization (e.g., by chemical-mechanical polishing) or cleaning prior to deposition of one or more epitaxial layers thereon. A strained epitaxial layer 220 is then deposited on semiconductor substrate 200, e.g., by organometallic vapor-phase epitaxy, to a thickness exceeding its predicted critical thickness. As can be seen in FIG. 1, the predicted critical thickness of an exemplary epitaxial layer 220 consisting of Al$_x$Ga$_{1-x}$N grown on a semiconductor substrate 200 consisting of AlN depends on the Al content x. In an embodiment, the thickness of epitaxial layer 220 exceeds its predicted critical thickness by at least a factor of 5, or even by at least a factor of 10, and epitaxial layer 220 remains pseudomorphic. The thickness of epitaxial layer 220 may even exceed its predicted critical thickness by a factor of 20 or more.

In certain embodiments, epitaxial layer 220 may actually consist of a plurality of discrete layers, each one pseudomorphically strained to the lattice parameter of semiconductor substrate 200. The plurality of layers may include layers with graded composition, e.g., layers including AlN, InN, and/or GaN in which the concentration of one or more of the group III atoms changes with thickness. Such layers may be graded in discrete steps or linearly in composition.

Strained epitaxial layer 220 may also be deposited on an optional relaxed semiconductor layer (not shown) formed over semiconductor substrate 200. In this case, the strain in epitaxial layer 220 and the predicted critical thickness therefor will be a function of the lattice parameter of the relaxed semiconductor layer rather than that of semiconductor substrate 200. Epitaxial layer 220 remains pseudomorphic, and the thickness of epitaxial layer 220 exceeds this predicted critical thickness by at least a factor of 5. In certain embodiments, the thickness of epitaxial layer 220 exceeds this predicted critical thickness by at least a factor of 10 or even at least a factor of 20. Thus, either semiconductor substrate 200 or the optional relaxed semiconductor layer can act as a relaxed "platform" to which epitaxial layer 220 is strained.

The ability to grow highly strained alloys of III-nitride on substrates with low threading dislocation density ("TDD"), e.g., certain AlN substrates, has been found to be dependent on: (i) substrate crystal quality, (ii) surface preparation, (iii) crystal orientation of the substrate surface, (iv) alloy concentration, (v) growth conditions including substrate temperature and V-III ratio during growth, and/or (vi) rate of grading of the alloy concentration. Relaxation of epitaxial layer 220 may be minimized or eliminated by maintenance of low surface roughness during epitaxial growth. Roughening of the layer surface or island formation may lead to detrimental relaxation of the layer. Defects at the surface of the semiconductor substrate 200, which may be due either to defects in the substrate which have propagated to the surface or to improper surface cleaning, may also cause roughening of epitaxial layer 220. Once roughening occurs, strain relaxation occurs at the sidewalls of terraces and islands on the epitaxial surface. When these terraces and islands coalesce, they may deleteriously form high densities of threading dislocations at the coalescence boundaries.

Maintenance of step-flow growth during the epitaxial deposition aids the prevention of relaxation, and the proper conditions for step-flow growth depend on the substrate orientation of the semiconductor substrate 200. When substrates are very closely oriented to on-axis (i.e., the surface normal of the substrate is very closely aligned to a major crystallographic axis), the density of steps across the surface of the substrate is low. Thus, incoming Al, Ga, or In atoms must diffusive relatively large distances to incorporate into the growing epitaxial layer at a step edge, i.e., maintain step-flow growth. Thus, step-flow growth may be maintained by (i) enhancing the long-distance diffusion of incoming atoms of the growth species and/or (ii) reducing the diffusion distance required to reach a step edge (i.e., increase the step density on the surface). Such long-distance diffusion may be enhanced by performing the epitaxial growth at higher temperatures (i.e., up to approximately 1100° C.) or, in the case of In-free, high Al content (e.g., greater than approximately 50% Al content), by increasing the growth temperature to a range of greater than approximately 1100° C. to approximately 1300° C. In some embodiments, e.g., for Al concentrations greater than 50%, long-distance diffusion may also be enhanced by decreasing the ratio of the nitrogen species (i.e., the group V species) in the epitaxial reactor in comparison to the group III species. In an embodiment, a V-III ratio beneficial for enhancing long-distance diffusion of the growth species is less than approximately 1,000, and may even be less than approximately 10. The density of step edges on semiconductor substrate 200 may also be increased (thus reducing the required diffusion distances required to reach a step) by increasing the misorientation between the major crystallographic axis and the surface normal of the substrate. In an embodiment, the misorientation of semiconductor substrate 200 is approximately 1°.

Kinetic barriers to strain relaxation may also be beneficially utilized to produce thick pseudomorphic epitaxial layers. Since any alloy of AlN, GaN, and InN (with nonzero content of either GaN or InN) will have a larger relaxed lattice parameter than an underlying AlN substrate, these epitaxial films will typically not relax by cracking. Relaxation may occur by the formation of misfit dislocations which run parallel to the interface between the AlN substrate and epitaxial alloy layer. These misfit dislocations may either result from the motion of existing threading dislocations which propagate into epitaxial layer 220 from semiconductor substrate 200, or from new dislocation loops forming either from the surface or from some macroscopic defect on the surface of substrate 200. Thus, the elimination of defect sources in semiconductor substrate 200 creates kinetic barriers to relaxation, facilitating the fabrication of thick pseudomorphic epitaxial layer 220. In an embodiment, semiconductor substrate 200 has a threading dislocation density less than approximately $10^6$ cm$^{-2}$. In other embodiments, semiconductor substrate 200 has a threading dislocation density less than approximately $10^4$ cm$^{-2}$ or even less than approximately $10^2$ cm$^{-2}$. Semiconductor substrate 200 may also have a density of particulate surface defects less than approximately 100 cm$^{-2}$. Utilization of such optimized semiconductor substrates minimizes or eliminates glide of existing dislocations and dislocation nucleation at surface defects as relaxation mechanisms. The remaining relaxation mechanism—surface nucleation of dislocation loops—occurs only at strain energies sufficiently high to facilitate fabrication of thick pseudomorphic epitaxial layers. Therefore, the fabrication of thick strained epitaxial layer 220 having a thickness greater than its predicted critical thickness by at least approximately a factor of 5 is facilitated. Moreover, since In may have the additional effect of hindering dislocation motion and concomitant relaxation, a strained epitaxial layer 220 containing In may achieve a pseudomorphic thickness greater than its predicted critical thickness by at least approximately a factor of 10.

In addition, certain crystallographic orientations of semiconductor substrate 200 may be particularly favorable in the fabrication of thick epitaxial layers of highly strained alloys. In particular, Liu et al. point out, the main slip system of the wurzite crystal structure of GaN and its alloys is <11.2>{00.2}. (See R. Liu, J. Mei, S. Srinivasan, H. Omiya, F. A. Ponce, D. Chems, Y. Narukawa and T. Mukai, "Misfit Dislocation Generation in InGaN Epilayers on Free-Standing GaN," *Jap. J. Appl. Physics* 45, L549 (2006), the entire disclosure of which is hereby incorporated by reference.) This slip system will not be active in a well-oriented c-face substrate (i.e., a substrate in which the surface normal is aligned with the c-axis of the crystal) since the lattice-mismatch strain will not result in any resolved stress to move dislocations along this plane. This phenomenon may limit the allowable miscut for c-face substrates to enable very large strains and/or thick pseudomorphic epitaxial layers thereon. However, as described above, step-flow growth is facilitated by a finite surface misorientation. Thus, in an embodiment, the misorientation of semiconductor substrate 200 is greater than 0° but is less than approximately 4°.

In one procedure, a large c-face AlN substrate with low dislocation density (roughly $5\times10^3$ cm$^{-2}$) was prepared as described in the '660 application. The miscut of this substrate was approximately 1°. The Al-polarity surface of the c-face AlN substrate—the (0001) face—was prepared as described in U.S. Pat. No. 7,037,838 ("the '838 patent"), the entire disclosure of which is hereby incorporated by reference. After introducing the substrate into an Aixtron model 200/4 RF-S organometallic vapor-phase epitaxy ("OMVPE") reactor, the substrate was heated to ~1100° C. under flowing hydrogen and ammonia gas mixture. Trimethylaluminum ("TMA") was then introduced and a 0.3-μm-thick AlN buffer layer was grown on the substrate at an approximate growth rate of 0.6 μm/hr. A graded layer $Al_xGa_{1-x}N$ was then grown by switching in trimethylgallium ("TMG") with ramping up TMG and ramping down the TMA gas flow to reach the target Al % over a 15 minute interval to grow approximately 0.1 μm of linearly graded alloy. After this transition layer, the TMA and TMG flows were kept constant and a final layer of ~63% Al concentration and approximately 0.6 μm thickness was grown with an approximate growth rate of 1.0 μm/hr. During growth, the chamber pressure was maintained at ~25 to 100 mbar. The V-III ratio was maintained between 500 and 2,000 during the growth sequence. The parallel strain (i.e., strain in the plane of the substrate) was measured to be slightly greater than 0.8% and represented pseudomorphic growth even though the layer exceeded the predicted critical thickness by more than an order of magnitude. The double-crystal ω rocking curve widths about the (00.2) and the (10.2) reflections (measured with a Philip X'Pert system) for the $Al_xGa_{1-x}N$ layer were 50 arcsec and 60 arcsec, respectively. The strain parallel to the interface was measured to be nearly 1% and the epitaxial layer was pseudomorphic to the underlying AlN substrate. Etch pit densities were measured using a molten KOH etch to determine the density of threading dislocations in the $Al_xGa_{1-x}N$ epitaxial layer. The measured densities were in the range of $0.8-3\times10^5$ cm$^{-2}$.

A similar procedure was used to grow a 0.6 μm-thick epitaxial layer of an $Al_xGa_{1-x}N$ alloy that had an Al concentration of 50%. In this case, the strain parallel to the interface remained ~1%, which represents approximately 80% of the fully pseudomorphic strain.

In another procedure, a large c-face AlN substrate with a dislocation density of approximately $5\times10^3$ cm$^{-2}$ was prepared as described in the '660 application. The Al-polarity surface of the c-face AlN substrate (misaligned by approximately 1.5°) was prepared as described in the '838 patent. After introducing the substrate into a Veeco D180 OMVPE reactor, the substrate was heated to approximately 1100° C. under a flowing hydrogen and ammonia gas mixture. TMA was then introduced and a 0.4 μm-thick AlN buffer layer was grown on the substrate at an approximate growth rate of 0.4 μm/hr. A graded layer $Al_xGa_{1-x}N$ was then grown by switching in TMG with ramping up TMG while maintaining TMA gas flow to reach the target Al % over a 6-minute interval to grow approximately 0.05 μm of linearly graded alloy. After this transition layer, the TMA and TMG flows are kept constant and a final layer of 58% Al concentration and approximately 0.5 μm thickness was grown with an approximate growth rate of 0.8 μm/hr. During growth, the chamber pressure was maintained at approximately 20 Torr. The V-III ratio was maintained between 900 and 3,200 during growth sequence. The parallel strain was measured to be slightly greater than 1.0% and represented pseudomorphic growth even though the layer exceeded the predicted critical thickness by more than an order of magnitude.

While imperfect surface preparation may increase the dislocation density, this can be remedied by improving the surface preparation. For low-defect AlN substrates, appropriate surface preparation techniques are described in the '838 patent and in U.S. Patent Application Publication No. 2006/0288929A1, the entire disclosure of which is hereby incorporated by reference.

As pseudomorphic epitaxial layer(s) 220 experience little or no lattice relaxation, the threading dislocation density therein may be approximately equal to the threading dislocation density of semiconductor substrate 200. For example, substrates from AlN boules grown by the techniques described in the '660 application may have very low dislocation densities—under 10,000 cm$^{-2}$, typically about 1,000 cm$^{-2}$, and, in certain embodiments, under 500 cm$^{-2}$ and even under 100 cm$^{-2}$—that are "inherited" by pseudomorphic epitaxial layers grown thereon. In other embodiments, the threading dislocation density of epitaxial layer 200 may be greater than that of semiconductor substrate 200 by no more than approximately a factor of 10. Such low threading dislocation densities enable fabrication of highly efficient ultraviolet light-emitting diodes ("UV LEDs") and laser diodes ("LDs"), as well as electronic devices, such as transistors for high-frequency (e.g., >2 GHz), high-power operation.

In an embodiment, strained epitaxial layer 220 is substantially free of local elastic strain relaxation caused by the formation of, e.g., macroscopic defects such as islands and pinholes (further described below). Moreover, the strain in epitaxial layer 220 may be approximately completely a result of lattice mismatch to substrate 200. For example, epitaxial layer 220 will be approximately free of strain due to thermal expansion mismatch with substrate 200.

For device applications, polarization effects in epitaxial layer 220 may affect device performance. For epitaxial layer 220 fabricated on top surface 210 which is non-polar (e.g., the a- or m-plane of a substrate 200 consisting of AlN), polarization effects in the layer are minimized. This makes a subsequently formed device inherently insensitive to polarization effects associated with the surface, and eliminates or minimizes dc-to-RF dispersion observed in conventional devices grown on polar surfaces, e.g., the c-plane. On the other hand, pseudomorphic structures grown on the c-plane along the [0001] direction may have strong polarization effects which influence the charge distribution within the device. Preferably, the polarization charge at the channel/barrier interface is carefully increased to counteract backside depletion effects associated with the AlN/GaN hetero-interface transitioning from the AlN buffer structure.

Device Applications

A key issue limiting the performance of deep-UV LEDs is high dislocation density in the active device region which reduces the electrical efficiency, the internal quantum efficiency ("IQE"), and the lifetime of the devices. Briefly, as described in the *Solid State Lighting Report* (Dept. of Energy, 2007), the entire disclosure of which is hereby incorporated by reference, the electrical efficiency, $\eta_v$ (defined as photon energy divided by the product of the applied voltage and electron charge, i.e., hλ/eV), represents the amount of electrical energy converted to photon energy. The applied forward voltage is determined by the diode characteristics, and should be as low as possible in order to get the maximum current (and hence maximize the number of electrons eligible to convert to photons) for a given input power. The IQE is the ratio of the photons created in the active region of the semiconductor chip to the number of electrons injected into the LED.

Figure 3:
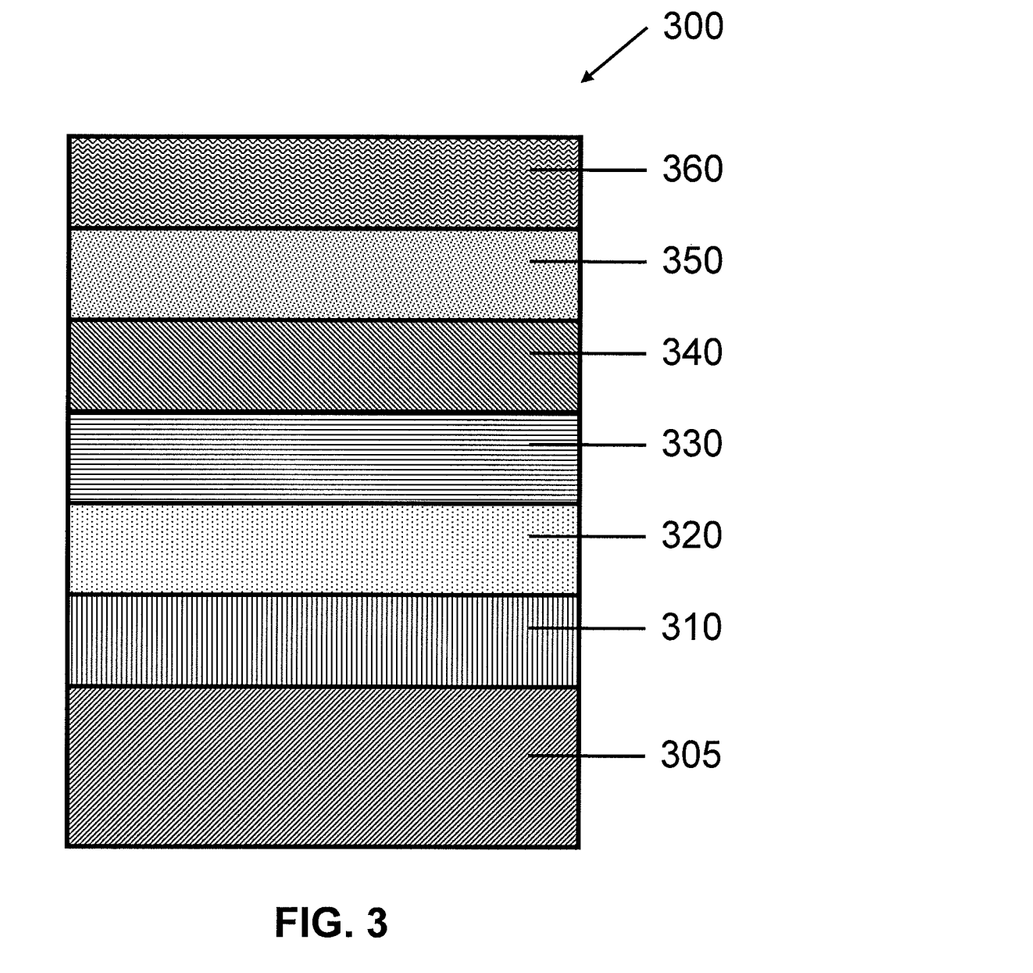
FIG. 3 is a schematic of a pseudomorphic strained layer-based device structure.

Referring to FIG. 3, a pseudomorphic UV light emitting diode ("PUVLED") structure 300 is formed. A semiconductor substrate 305, which includes or consists essentially of one or more semiconductor materials, is provided. In an embodiment, semiconductor substrate 305 includes or consists essentially of a III-nitride semiconductor material, e.g., AlN. Semiconductor substrate 305 may be miscut such that the angle between its c-axis and its surface normal is between 0.3° and 4°. In a preferred embodiment, the misorientation of the surface of semiconductor substrate 305 is approximately 1°. The surface of semiconductor substrate 305 may have an Al- or N-polarity, and may be planarized, e.g., by chemical-mechanical polishing. In an embodiment, the surface of semiconductor substrate 305 is prepared as disclosed in the '838 patent. The RMS surface roughness of semiconductor substrate is preferably less than approximately 0.5 nm for a 10 µm×10 µm area. In some embodiments, atomic-level steps are detectable on the surface when probed with an atomic-force microscope. The threading dislocation density of semiconductor substrate 305 may be measured using, e.g., etch pit density measurements after a 5 minute KOH—NaOH eutectic etch at 450° C. Preferably the threading dislocation density is less than approximately $2 \times 10^3$ cm$^{-2}$. In some embodiments substrate 305 has an even lower threading dislocation density, as described above in reference to semiconductor substrate 200. Semiconductor substrate 305 may be topped with a homoepitaxial layer (not shown) that includes or consists essentially of the same semiconductor material present in semiconductor substrate 300, e.g., AlN.

In an embodiment, a graded buffer layer 310 is formed on semiconductor substrate 305. Graded buffer layer 310 may include or consist essentially of one or more semiconductor materials, e.g., $Al_xGa_{1-x}N$. In a preferred embodiment, graded buffer layer 310 has a composition approximately equal to that of semiconductor substrate 305 at an interface therewith in order to promote two-dimensional growth and avoid deleterious islanding (such islanding may result in undesired elastic strain relief in graded buffer layer 310 and subsequently grown layers). The composition of graded buffer layer 310 at an interface with subsequently grown layers (described below) is generally chosen to be close to that of the desired active region of the device (e.g., the $Al_xGa_{1-x}N$ concentration that will result in the desired wavelength emission from the PUVLED). In an embodiment, graded buffer layer 310 includes $Al_xGa_{1-x}N$ graded from an Al concentration x of approximately 100% to an Al concentration x of approximately 60%.

A bottom contact layer 320 is subsequently formed above graded layer 310, and may include or consist essentially of $Al_xGa_{1-x}N$ doped with at least one impurity, e.g., Si. In an embodiment, the Al concentration x in bottom contact layer 320 is approximately equal to the final Al concentration x in graded layer 310. Bottom contact layer 320 may have a thickness sufficient to prevent current crowding after device fabrication (as described below) and/or to stop on during etching to fabricate contacts. For example, the thickness of bottom contact layer 320 may be less than approximately 200 nm. When utilizing a bottom contact layer 320 of such thickness, the final PUVLED may be fabricated with backside contacts, as described below in reference to FIG. 4B. In many embodiments, bottom contact layer 320 will have high electrical conductivity even with a small thickness due to the low defect density maintained when the layer is pseudomorphic.

A multiple-quantum well ("MQW") layer 330 is fabricated above bottom contact layer 320. MQW layer 330 corresponds to the "active region" of PUVLED structure 300 and includes a plurality of quantum wells, each of which may include or consist essentially of AlGaN. In an embodiment, each period of MQW layer 330 includes an $Al_xGa_{1-x}N$ quantum well and an $Al_yGa_{1-y}N$ quantum well, where x is different from y. In a preferred embodiment, the difference between x and y is large enough to obtain good confinement of the electrons and holes in the active region, thus enabling high ratio of radiative recombination to non-radiative recombination. In an embodiment, the difference between x and y is approximately 0.05, e.g., x is approximately 0.35 and y is approximately 0.4. However, if the difference between x and y is too large, e.g., greater than approximately 0.3, deleterious islanding may occur during formation of MQW layer 330. MQW layer 330 may include a plurality of such periods, and may have a total thickness less than approximately 50 µm. Above MQW layer 330 may be formed an optional thin electron-blocking (or hole-blocking if the n-type contact is put on top of the device) layer 340, which includes or consists essentially of, e.g., $Al_xGa_{1-x}N$, which may be doped with one or more impurities such as Mg. Electron-blocking layer 340 has a thickness of, e.g., approximately 20 nm. A top contact layer 350 is formed above electron blocking layer 340, and includes or consists essentially of one or more semiconductor materials, e.g., $Al_xGa_{1-x}N$, doped with at least one impurity such as Mg. Top contact layer 350 is doped either n-type or p-type, but with conductivity opposite that of bottom contact layer 310. The thickness of top contact layer 350 is, e.g., between approximately 50 nm and approximately 100 nm. Top contact layer 350 is capped with a cap layer 360, which includes or consists essentially of one or more semiconductor materials doped with the same conductivity as top contact layer 350. In an embodiment, cap layer 360 includes GaN doped with Mg, and has a thickness between approximately 10 nm and approximately 200 nm, preferably approximately 50 nm. In some embodiments, high-quality ohmic contacts may be made directly to top contact layer 350 and cap layer 360 is omitted. While it is preferred that layers 310-350 are all pseudomorphic, cap layer 360 may relax without introducing deleterious defects into the active layers below which would adversely affect the performance of PUVLED structure 300. As described below with reference to FIGS. 4A and 4B, etching and final contact formation completes the formation of PUVLED structure 300. Each of layers 310-350 is pseudomorphic, and each layer individually may have a thickness greater than its predicted critical thickness, as described above. Moreover, the collective layer structure including layers 310-350 may have a total thickness greater than the predicted critical thickness for the layers considered collectively (i.e., for a multiple-layer structure, the entire structure has a predicted critical thickness even when each individual layer would be less than a predicted critical thickness thereof considered in isolation).

In a preferred embodiment, PUVLED structure 300 (and/or strained epitaxial layer 220 described above) are formed substantially free (i.e., having less than approximately 1 mm$^{-2}$, or even approximately 0 mm$^{-2}$) of macroscopic defects such as pinholes, mounds, or "V pits." Such defects are often observed in the growth of, e.g., strained InGaN layers on GaN substrates with high dislocation densities. (See T. L. Song, J. Appl. Phys. 98, 084906 (2005), the entire content of which is hereby incorporated by reference). Macroscopic defects may cause local relaxation of the strain in the pseudomorphic layer(s), deleteriously affect devices fabricated from the epitaxial layers due to disruptions of the quantum well structures and/or shorting of the p- and n-type contacts, or increase the surface roughness of the layers. Macroscopic defect-free PUVLED structure 300 may advantageously be utilized in the fabrication of PUVLEDs sized greater than approximately 0.1 mm×approximately 0.1 mm.

PUVLED structure 300 has an emission wavelength in the range of approximately 210 nm to approximately 320 nm, e.g., approximately 280 nm. As at least most of the layers in PUVLED structure 300 are pseudomorphic, the threading dislocation density in the layers is less than approximately $10^5$ cm$^{-2}$, and may be approximately equal to the threading dislocation density in substrate 305. In an embodiment, PUVLED structure 300 has a wall-plug efficiency (i.e., total optical power out divided by total electrical power in) greater than approximately 10% (or even greater than approximately 20% in some embodiments) and/or a lifetime greater than approximately 10,000 hours.

Laser diode (LD) structures may also benefit from a pseudomorphic structure. A preferred LD structure will be similar to that of PUVLED structure 300, with the addition of layers which properly confine photons to create a resonant cavity. In an edge-emitter LD, the resonant cavity will be directed perpendicular to the growth direction and mirrors will be created by cleaving or etching the semiconductor layer structure. In this case, layer 320 below the MQW layer 330 and layers 340 and 350 above the MQW will need to be modified to act as effective cladding layers to ensure that the emitted photons effectively propagate perpendicular to layer growth direction without significant absorption. For example, one may increase the number of layers schematically labeled as 320, 340 and 350 in FIG. 3. Alternatively, in a vertical cavity surface-emitting laser ("VCSEL"), layers 320, 340, and 350 may be replaced with multilayer structures that will act as mirrors (e.g., Bragg reflectors) to create a photon cavity that will direct photons along the growth direction of the semiconductor layers. In this way, a semiconductor LD fabricated with nitride semiconductors may have an emission wavelength shorter than approximately 300 nm, and, in some embodiments, shorter than approximately 280 nm.

Figure 4A:
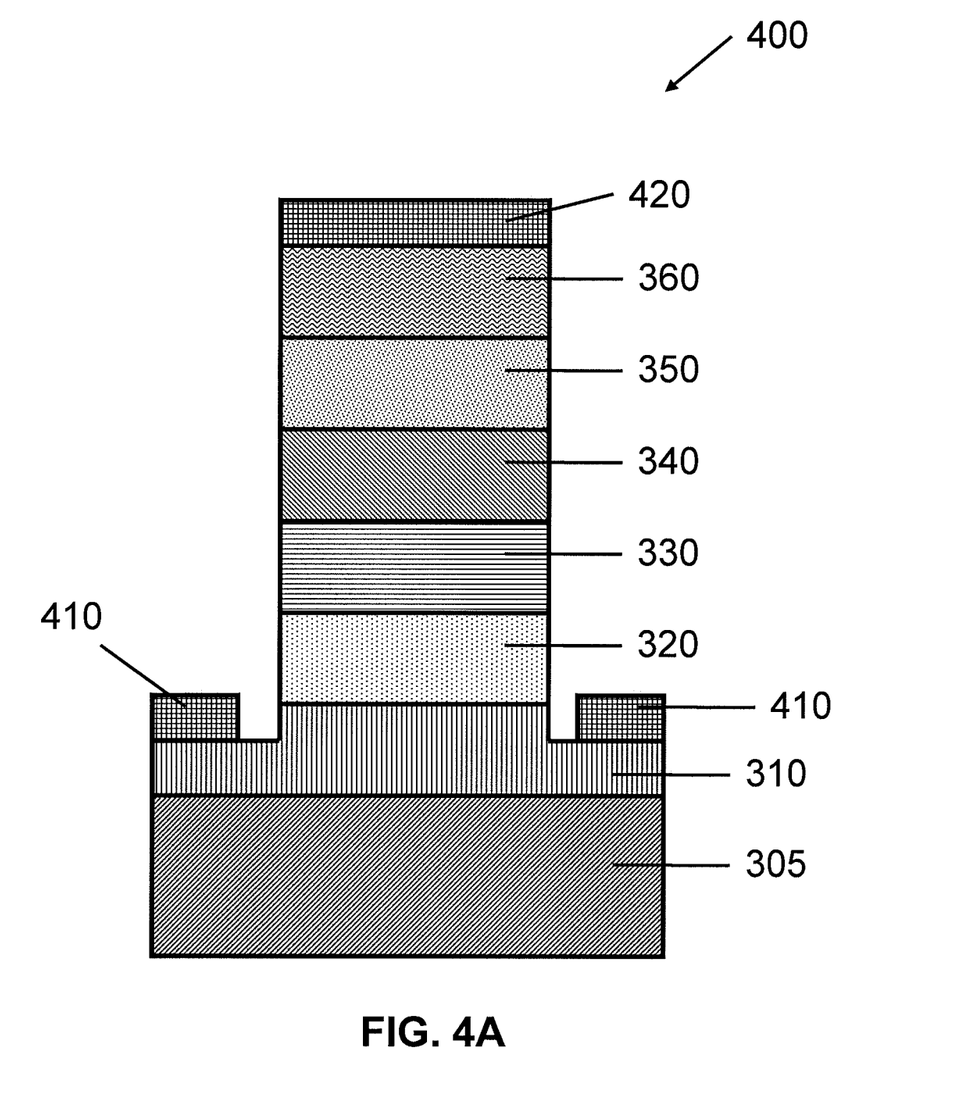
FIGS. 4A and 4B are schematics of processed devices utilizing the layer structure of FIG. 3.
Figure 4B:
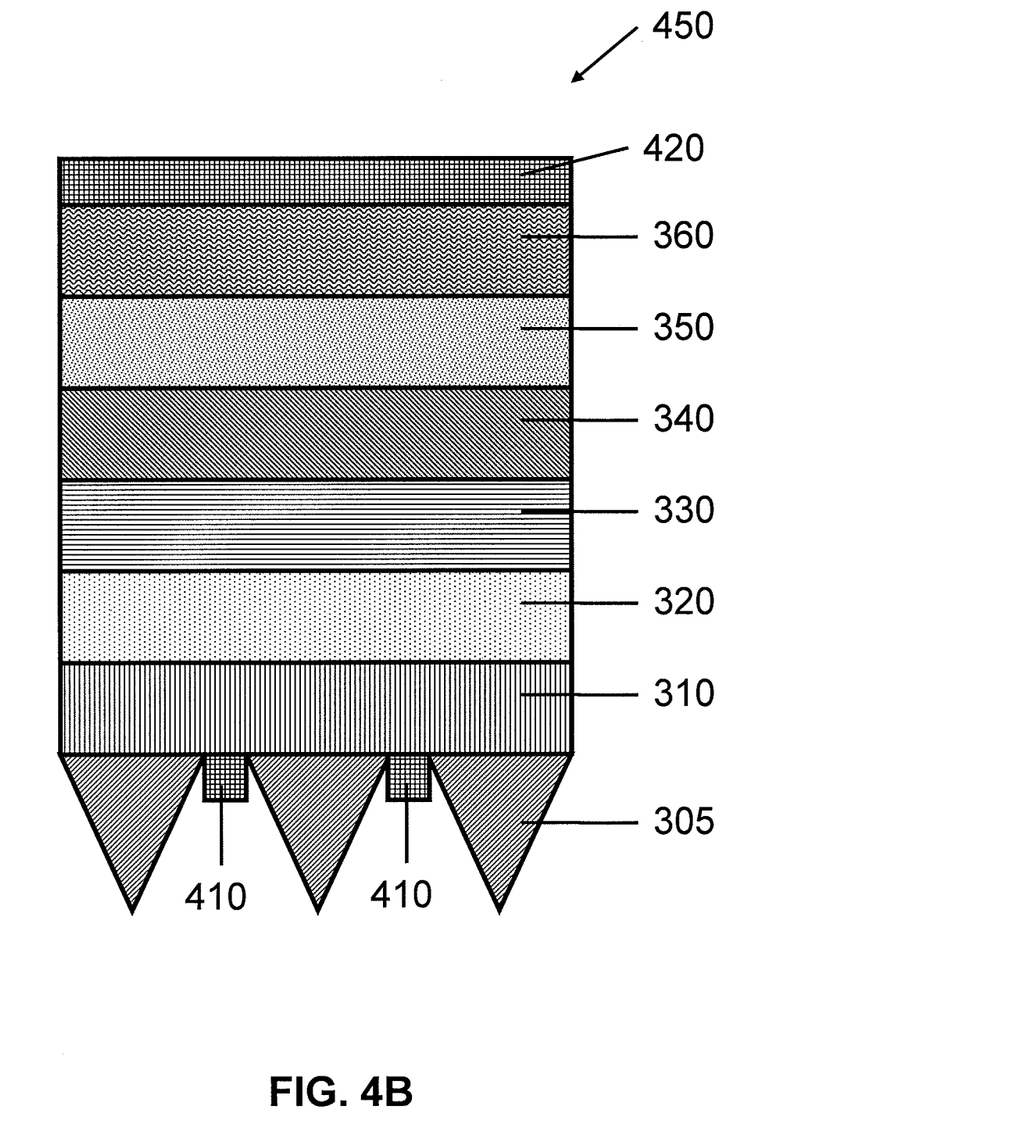

Referring to FIGS. 4A and 4B, different contact schemes may be utilized in conjunction with PUVLED structure 300. PUVLED 400 is formed by etching, e.g., plasma etching, through the layer sequence in PUVLED structure 300 and stopping on or in bottom contact layer 310. Contacts 410, 420 are formed on bottom contact layer 310 and on cap layer 360, respectively. Contacts 410, 420 are formed of a conductive material, e.g., a metal such as Ni/Au alloy (typically used for p-type contacts) or a Ti/Al/Ti/Au stack (typically used for n-type contacts), and may be formed by, e.g., sputtering or evaporation. Contacts 410, 420 may include or consist essentially of the same or different conductive materials (such that optimal contact is made to the oppositely doped bottom contact layer 310 and cap layer 360). Contact 420 may also include an ultraviolet ("UV") reflector. The UV reflector is designed to improve the extraction efficiency of photons created in the active region of the device by redirecting photons which are emitted toward contact 420 (where they cannot escape from the semiconductor layer structure) and redirecting them toward a desired emission surface, e.g., the bottom surface of PUVLEDs 400, 450.

In PUVLED 450, contact 420 is also formed above cap layer 360. However, contact 410 (which may be a plurality of separate contacts), is formed on the backside of the PUVLED active layer structure. In this case, substrate 305 is optionally thinned to approximately 150 μm by, e.g., mechanical grinding or polishing. A mask layer (not shown), formed of, e.g., Ni, is formed on the backside of substrate 305 and patterned by standard photolithography. The exposed regions of substrate 305 are etched by, e.g., plasma or wet etching, and the etch is stopped on or in bottom contact layer 310. Etch stopping on bottom contact layer 310 is facilitated by detection of Ga in the plasma etcher as substrate 305 will be pure AlN in many embodiments. Contact 410 is then formed on the exposed portions of bottom contact layer 310. Contact 410 may be interdigitated to maximize the light output from PUVLED 450. Importantly, the tapered structures created on the backside of substrate 305 will help gather photons from a much larger emission angle from the MQW structure in layer 340 and direct them out the emission surface near the tips of the taped features shown on the etched backside of the substrate 305 shown in FIG. 4B. This will substantially improve the photon extraction efficiency of the PUVLED since, without the tapered structures, only a small fraction of the photons directed toward a flat emission surface (such as that shown in FIG. 4A) will fall with the critical acceptance cone for emission due to the large index of refraction for these semiconductor materials. For AlN, the acceptance cone is only approximately 25°, which means that approximately 90% of the photons directed toward a flat emission surface (assuming isotropic emission of radiation into the hemisphere directed toward the flat surface) will undergo total internal reflection and be unable to escape from the device and, thus, not be realized as useful emission.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A semiconductor heterostructure comprising:
an aluminum nitride single-crystal substrate; and
at least one strained layer epitaxially grown thereover, the layer comprising at least one of AlN, GaN, InN, or any binary or tertiary alloy combination thereof,
wherein a thickness of the strained layer exceeds a predicted critical thickness associated therewith by at least a factor of 5, as calculated with the Matthews-Blakeslee theory, $$h_c = \frac{b}{8\pi f} \frac{(1 - v\cos^2\alpha)}{(1 + v)\cos\lambda} \left( \ln\left(\frac{h_c}{b}\right) + 1 \right),$$

where $h_c$ is the predicted critical thickness, b is the magnitude of the Burgers vector of a dislocation formed between the layer and the substrate, f is the lattice mismatch between the layer and the substrate, υ is the Poisson's ratio of the layer, λ is the angle between the slip direction of the layer and the direction in the plane of the layer perpendicular to the line of intersection of the slip plane of the layer and the interface between the layer and the substrate, and α is the angle between the dislocation and the Burgers vector of the dislocation.

2. The semiconductor heterostructure of claim 1, wherein the thickness of the at least one strained layer exceeds the predicted critical thickness by at least a factor of 10.

3. The semiconductor heterostructure of claim 1, wherein the at least one strained layer is substantially free of In.

4. The semiconductor heterostructure of claim 1, wherein the at least one strained layer has a density of macroscopic defects less than approximately 1 mm$^{-2}$.

5. The semiconductor heterostructure of claim 1, wherein a strain parallel to the at least one strained layer is greater than 80% of a difference between parallel lattice parameters of an unstrained alloy of the same composition as the at least one strained layer and a relaxed platform disposed beneath the at least one strained layer.

6. The semiconductor heterostructure of claim 5, wherein the at least one strained layer comprises $Al_xGa_{1-x}N$, the thickness of the at least one strained layer is greater than approximately 200 nm, and x is less than approximately 0.65.

7. The semiconductor heterostructure of claim 1, wherein the thickness of the at least one strained layer is greater than approximately 1 μm.

8. The semiconductor heterostructure of claim 1, wherein the at least one strained layer has an average threading dislocation density less than approximately 10,000 $cm^{-2}$.

9. A method for forming a semiconductor heterostructure, the method comprising:
  providing an aluminum nitride single-crystal substrate; and
  epitaxially depositing over the substrate a strained layer comprising at east one of AlN, GaN, InN, or any binary or tertiary alloy combination thereof,
  wherein a thickness of the strained layer exceeds a predicted critical thickness associated therewith by at least a factor of 5, as calculated with the Matthews-Blakeslee theory, $$h_c = \frac{b}{8\pi f} \frac{(1 - v\cos^2\alpha)}{(1 + v)\cos\lambda}\left(\ln\left(\frac{h_c}{b}\right) + 1\right),$$

where $h_c$ is the predicted critical thickness, b is the magnitude of the Burgers vector of a dislocation formed between the layer and the substrate, f is the lattice mismatch between the layer and the substrate, υ is the Poisson's ratio of the layer, λ is the angle between the slip direction of the layer and the direction in the plane of the layer perpendicular to the line of intersection of the slip plane of the layer and the interface between the layer and the substrate, and α is the angle between the dislocation and the Burgers vector of the dislocation.

10. The method of claim 9, further comprising forming a buffer layer over the substrate prior to depositing the strained layer.

11. The method of claim 10, further comprising forming a graded layer between the buffer layer and the strained layer.

12. The method of claim 9, wherein the thickness of the strained layer exceeds the predicted critical thickness by at least a factor of 10.

13. The method of claim 9, wherein the strained layer is substantially free of In.

14. The method of claim 9, wherein the strained layer has a density of macroscopic defects less than approximately 1 $mm^{-2}$.

15. The method of claim 9, wherein the strained layer comprises AlGaN, and epitaxially depositing the strained layer comprises introducing trimethylaluminum and trimethylgallium into a reactor.

16. The method of claim 15, wherein an initial flow rate of the trimethylgallium during the deposition of the strained layer is lower than a final trimethylgallium flow rate.

17. The method of claim 9, wherein the aluminum nitride single-crystal substrate has an RMS surface roughness less than approximately 0.5 nm for a 10 μm×10 μm area, a surface misorientation between approximately 0.3° and 4°, and a threading dislocation density less than approximately $10^4$ $cm^{-2}$.

18. The method of claim 9, wherein a threading dislocation density of the strained layer is approximately equal to a threading dislocation density of the aluminum nitride single crystal substrate.

19. A device selected from the group consisting of a field effect transistor, a light-emitting diode, and a laser diode, the device comprising at least a portion of a strained heterostructure including:
  an aluminum nitride single-crystal substrate; and
  at least one strained layer epitaxially grown thereover, the layer comprising at least one of AlN, GaN, InN, or any binary or tertiary alloy combination thereof,
  wherein a thickness of the strained layer exceeds a predicted critical thickness associated therewith by at least a factor of 10, as calculated with the Matthews-Blakeslee theory, $$h_c = \frac{b}{8\pi f} \frac{(1 - v\cos^2\alpha)}{(1 + v)\cos\lambda}\left(\ln\left(\frac{h_c}{b}\right) + 1\right),$$

where $h_c$ is the predicted critical thickness, b is the magnitude of the Burgers vector of a dislocation formed between the layer and the substrate, λ is the lattice mismatch between the layer and the substrate, υ is the Poisson's ratio of the layer, λ is the angle between the slip direction of the layer and the direction in the plane of the layer perpendicular to the line of intersection of the slip plane of the layer and the interface between the layer and the substrate, and α is the angle between the dislocation and the Burgers vector of the dislocation.

20. The device of claim 19, wherein the device is a light-emitting diode comprising at least one interdigitated contact.

21. A device selected from the group consisting of a field effect transistor, a light-emitting diode, and a laser diode, the device comprising at least a portion of a strained heterostructure including:
  an aluminum nitride single-crystal substrate; and
  a plurality of strained layers epitaxially grown thereover, each of the plurality of strained layers comprising at least one of AlN, GaN, InN, or any binary or tertiary alloy combination thereof,
  wherein a total thickness of the plurality of strained layers exceeds a predicted critical thickness associated therewith by at least a factor of 10, as calculated with the Matthews-Blakeslee theory, $$h_c = \frac{b}{8\pi f} \frac{(1 - v\cos^2\alpha)}{(1 + v)\cos\lambda}\left(\ln\left(\frac{h_c}{b}\right) + 1\right),$$

where $h_c$ is the predicted critical thickness, b is the magnitude of the Burgers vector of a dislocation formed between the layers and the substrate, f is the lattice mismatch between the layers and the substrate, υ is the Poisson's ratio of the layers, λ is the angle between the slip direction of the layers and the direction in the plane of the layers perpendicular to the line of intersection of the slip plane of the layers and the interface between the layers and the substrate, and α is the angle between the dislocation and the Burgers vector of the dislocation.

22. The device of claim 21, wherein a lattice parameter parallel to the surface of the aluminum nitride single-crystal substrate of each of the plurality of strained layers is different from a lattice parameter of the aluminum nitride single-crystal substrate by less than 0.2%.

23. The semiconductor heterostructure of claim 1, further comprising a relaxed cap layer disposed over the at least one strained layer.

24. The method of claim 9, further comprising forming over the strained layer a relaxed cap layer, the strained layer remaining strained after formation of the relaxed cap layer.

25. The method of claim 9, further comprising heating the substrate to approximately 1100° C. prior to epitaxially depositing the strained layer.

26. The method of claim 9, wherein the strained layer is epitaxially deposited at a temperature ranging from greater than approximately 1100° C. to approximately 1300° C.

27. The device of claim 19, further comprising a relaxed cap layer disposed over the at least one strained layer.

28. The device of claim 21, further comprising a relaxed cap layer disposed over the plurality of strained layers.

* * * * *

UNITED STATES PATENT AND TRADEMARK OFFICE
CERTIFICATE OF CORRECTION

PATENT NO. : 9,437,430 B2
APPLICATION NO. : 12/020006
DATED : September 6, 2016
INVENTOR(S) : Leo J. Schowalter et al.

It is certified that error appears in the above-identified patent and that said Letters Patent is hereby corrected as shown below:

In the Claims

In Claim 19, Column 14, Line 25, change "$\lambda$" to --f--.

Signed and Sealed this
Thirtieth Day of May, 2017

Michelle K. Lee
*Director of the United States Patent and Trademark Office*